United States Patent
Chung

(10) Patent No.: US 9,601,464 B2
(45) Date of Patent: Mar. 21, 2017

(54) THERMALLY ENHANCED PACKAGE-ON-PACKAGE STRUCTURE

(71) Applicant: Apple Inc., Cupertino, CA (US)

(72) Inventor: Chih-Ming Chung, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 14/328,127

(22) Filed: Jul. 10, 2014

(65) Prior Publication Data

US 2016/0013155 A1    Jan. 14, 2016

(51) Int. Cl.
*H01L 25/065* (2006.01)
*H01L 23/367* (2006.01)
(Continued)

(52) U.S. Cl.
CPC ...... *H01L 25/0657* (2013.01); *H01L 21/4889* (2013.01); *H01L 23/36* (2013.01);
(Continued)

(58) Field of Classification Search
CPC ....... H01L 24/17; H01L 25/105; H01L 24/11; H01L 21/4853; H01L 23/49816; H01L 25/50; H01L 21/565; H01L 21/52; H01L 23/49838; H01L 21/563; H01L 25/0657; H01L 23/5386; H01L 23/49811; H01L 23/481; H01L 23/3157; H01L 21/4889; H01L 23/36; H01L 23/3677; H01L 23/552; H01L 21/105; H01L 25/0652; H01L 25/18;
(Continued)

(56) References Cited

U.S. PATENT DOCUMENTS 7,187,060 B2    3/2007  Usui
7,443,693 B2   10/2008  Arnold et al.
(Continued)

FOREIGN PATENT DOCUMENTS

CN    102254901 B    12/2013
KR    20130042171 A   4/2013

OTHER PUBLICATIONS

PCT/US2016/041139, filed Jul. 6, 2016, International Search Report and Written Opinion, mailed Oct. 4, 2016, 14 pages.

*Primary Examiner* — Ermias Woldegeorgis
(74) *Attorney, Agent, or Firm* — Meyertons, Hood, Kivlin, Kowert & Goetzel, P.C.; Neal E. Persky; Lawrence J. Merkel

(57) ABSTRACT

In some embodiments, a semiconductor device package may include a semiconductor device package on package assembly. The package on package assembly may include a first package, a second package, and a shield. The first package may include a first surface, a second surface substantially opposite the first surface, a first die, and a first set of electrical conductors coupled to the first surface and configured to electrically connect the package on package assembly. The second package may include a third surface and a fourth surface substantially opposite the third surface, and a second die. The third surface may be coupled to the second surface. The first package may be electrically coupled to the second package. The shield may be applied to the fourth surface of the semiconductor device package assembly. In some embodiments, the shield may transfer, during use, heat from the first die.

17 Claims, 3 Drawing Sheets

(51) Int. Cl.
*H01L 25/00* (2006.01)
*H01L 23/552* (2006.01)
*H01L 21/48* (2006.01)
*H01L 23/36* (2006.01)
*H01L 25/10* (2006.01)

(52) U.S. Cl.
CPC ........ *H01L 23/3677* (2013.01); *H01L 23/552* (2013.01); *H01L 25/105* (2013.01); *H01L 25/50* (2013.01); H01L 2224/16145 (2013.01); H01L 2224/16225 (2013.01); H01L 2224/48091 (2013.01); H01L 2224/48227 (2013.01); H01L 2224/73257 (2013.01); H01L 2225/06506 (2013.01); H01L 2225/06537 (2013.01); H01L 2225/06589 (2013.01); H01L 2924/15311 (2013.01); H01L 2924/181 (2013.01)

(58) Field of Classification Search
CPC ....... H01L 23/3675; H01L 24/81; H05K 3/40; H05K 1/0284; H05K 1/0313; H05K 1/111; H05K 1/181
See application file for complete search history.

(56) References Cited

U.S. PATENT DOCUMENTS

| | | |
|---|---|---|
| 8,008,753 B1 | 8/2011 | Bolognia |
| 8,138,024 B2 | 3/2012 | Do et al. |
| 8,183,130 B2 | 5/2012 | Lee et al. |
| 8,378,466 B2 | 2/2013 | Chiu et al. |
| 8,379,400 B2 | 2/2013 | Sunohara |
| 8,653,633 B2 | 2/2014 | Liao et al. |
| 8,710,676 B2 | 4/2014 | Chou et al. |
| 8,786,060 B2 | 7/2014 | Yen et al. |
| 9,001,528 B2 | 4/2015 | Yorita et al. |
| 9,123,718 B1 | 9/2015 | Foster |
| 2006/0145361 A1 | 7/2006 | Yang et al. |
| 2009/0014847 A1 | 1/2009 | Chen et al. |
| 2009/0168386 A1 | 7/2009 | Suzuki et al. |
| 2009/0184414 A1 | 7/2009 | Park et al. |
| 2009/0256244 A1 | 10/2009 | Liao et al. |
| 2009/0302436 A1 | 12/2009 | Kim et al. |
| 2010/0020518 A1 | 1/2010 | Bustamante |
| 2010/0096741 A1 | 4/2010 | Pan et al. |
| 2010/0252937 A1 | 10/2010 | Uchiyama |
| 2011/0006408 A1 | 1/2011 | Liao |
| 2011/0260301 A1* | 10/2011 | Liao ...................... H01L 21/568 257/659 |
| 2012/0043668 A1 | 2/2012 | Refai-Ahmed et al. |
| 2012/0049347 A1* | 3/2012 | Wang ................... H01L 21/563 257/737 |
| 2012/0139090 A1 | 6/2012 | Kim et al. |
| 2012/0193770 A1 | 8/2012 | Yamada et al. |
| 2013/0082368 A1 | 4/2013 | Kim et al. |
| 2013/0133940 A1 | 5/2013 | Chen et al. |
| 2014/0150102 A1 | 5/2014 | Wang et al. |
| 2014/0246781 A1 | 9/2014 | Hosomi |
| 2015/0061095 A1 | 3/2015 | Choi et al. |
| 2015/0084192 A1 | 3/2015 | Chiu et al. |
| 2015/0171021 A1 | 6/2015 | Takano et al. |

\* cited by examiner

THERMALLY ENHANCED PACKAGE-ON-PACKAGE STRUCTURE

BACKGROUND

Technical Field

Embodiments described herein relate to semiconductor packaging and methods for packaging semiconductor devices. More particularly, some embodiments disclosed herein relate to a thermally efficient package-on-package ("PoP").

Description of the Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages. FIG. 1 depicts an embodiment of a package on package format 100. Package 100 may include several air gaps 110 which are formed within the package during manufacture. However, air is known as a very good insulator and as such results in poor thermal conduction between the components of the package. Semiconductor packaging may include a heat shield; however, current heat shields are relatively large pieces of metal which increase by a significant percentage a Z height of the semiconductor packaging.

SUMMARY

In some embodiments, a semiconductor device package may include a semiconductor device package on package assembly. The package on package assembly may include a first package, a second package, and a shield. The first package may include a first surface, a second surface substantially opposite the first surface, a first die, and a first set of electrical conductors coupled to the first surface and configured to electrically connect the package on package assembly. The second package may include a third surface and a fourth surface substantially opposite the third surface, and a second die. The third surface may be coupled to the second surface. The first package may be electrically coupled to the second package. The shield may be applied to the fourth surface of the semiconductor device package assembly. The shield may be thermally coupled to at least one of the exposed thermal conductors. The shield may transfer, during use, heat from the first die.

In some embodiments, the package on package assembly may include at least one exposed thermal conductor. The exposed thermal conductor may be positioned in the second package adjacent the third surface such that at least one of the exposed thermal conductors exposes through a perimeter surface of the second package.

In some embodiments, the package on package assembly may include a plurality of wires. The plurality of wires may be positioned in the second package thermally coupling the first die to at least one of the exposed thermal conductors.

BRIEF DESCRIPTION OF THE DRAWINGS

The following detailed description makes reference to the accompanying drawings, which are now briefly described.

Figure 1:
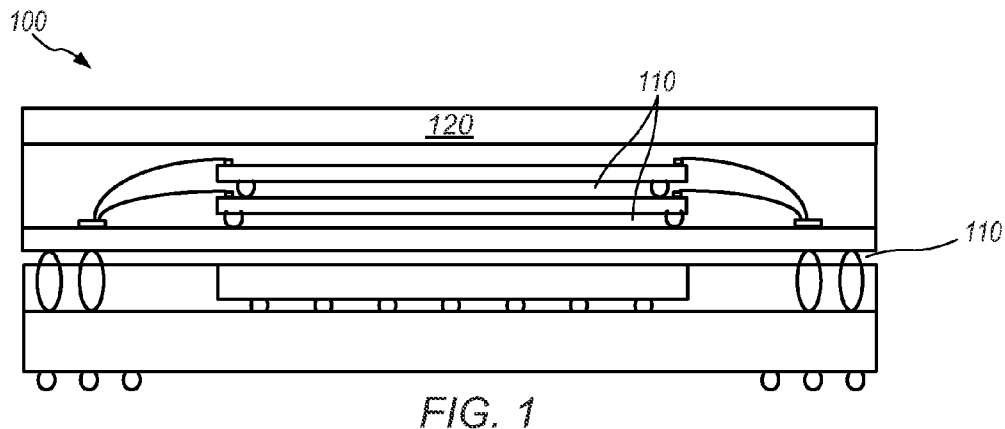
FIG. 1 depicts an embodiment of a current package on package format.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Figure 2:
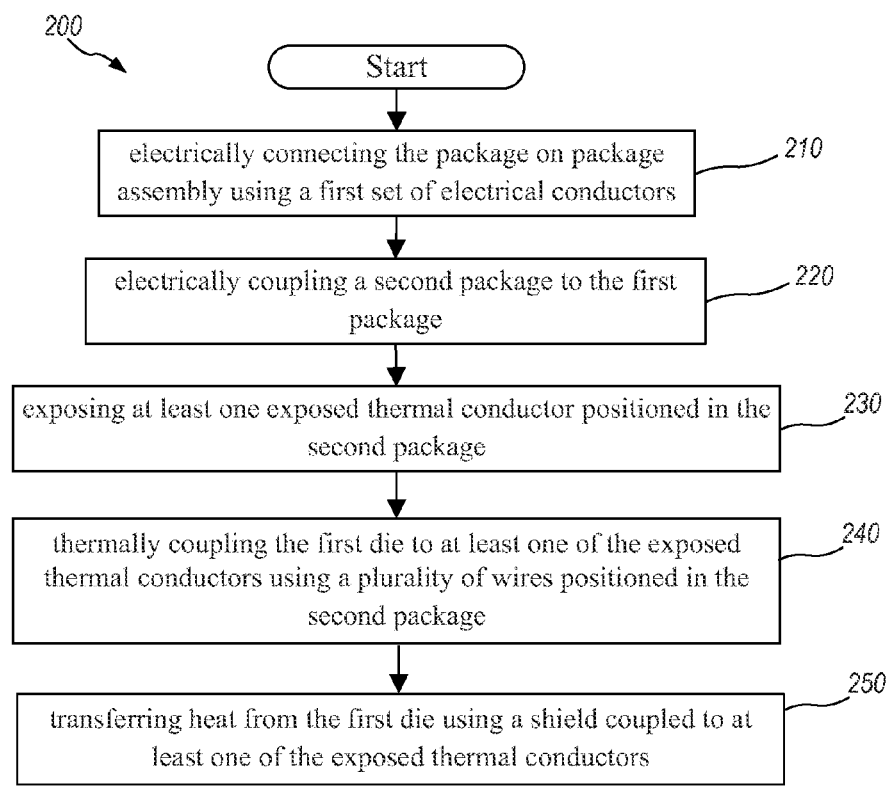
FIG. 2 depicts an embodiment of flow chart representing a method of forming at least a portion of a thermally enhanced package on package format.
Figure 3:
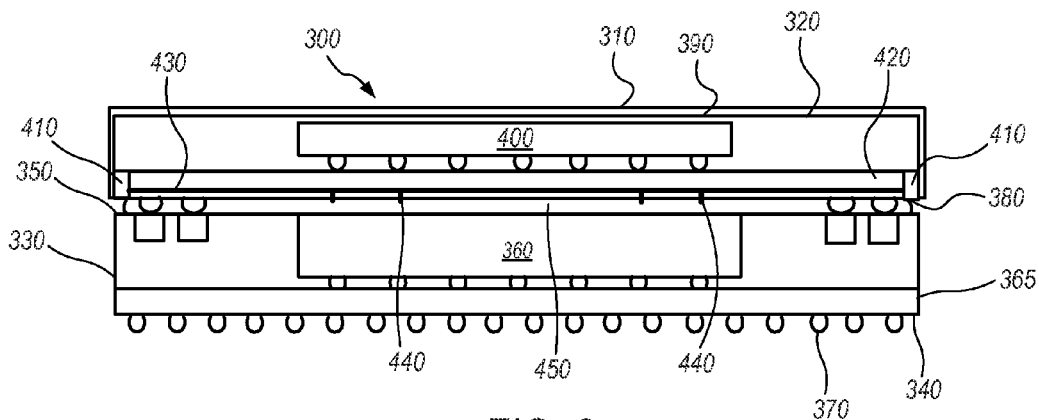
FIG. 3 depicts an embodiment of a thermally enhanced package on package format including a shield configured to dissipate heat. At least some of the electrical conductors are not depicted for the sake of clarity.

FIG. 2 depicts an embodiment of flow chart representing a method of forming at least a portion of a thermally enhanced package on package format (200). FIG. 3 depicts an embodiment of a thermally enhanced package on package format 300 including a shield 310 configured to dissipate heat. At least some of the electrical conductors are not depicted for the sake of clarity. In some embodiments, a semiconductor device package may include a semiconductor device package on package assembly 300. The package on package assembly 300 may include a first package 330, a second package 320, and a shield 310.

In some embodiments, the first package 330 may include a first surface 340, a second surface 350, and a first die 360. The second surface 350 may be substantially opposite the first surface 340. The first die 360 may be coupled to a first substrate 365 which, in some embodiments, may be a redistribution layer (RDL). The package assembly 300 may include a first set of electrical conductors 370 coupled to the first surface 340. The first set of electrical conductors 370 may be configured to electrically connect the package on package assembly 300 (210).

In some embodiments, the second package 320 may include a third surface 380, a fourth surface 390, and a second die 400. The fourth surface 390 may be substantially opposite the third surface 380. The third surface 380 may be coupled to the second surface 350. The first package may be electrically coupled to the second package (220). The shield 310 may be applied to the fourth surface 390 of the semiconductor device package assembly 300. The shield 310 may be thermally coupled to at least the first die 360. The shield 310 may transfer, during use, heat from the first die 360.

The shield 310 may function as a heat exchanger that moves heat between a heat source, and a secondary heat exchanger whose surface area and geometry are more favorable than the source. Such a shield is most often simply a material which has a high thermal conductivity.

In some embodiments, the shield may transfer heat from electronic components (e.g., first die 360) to passive or active heat sinks. Typically they are used to cool chips in personal computers, laptops, notebooks, cell phones, and other electronic devices. The shield may be used in critical locations for more efficient heat removal. The shield may be used to reduce electrical component hot spots, such that the component's lifetime is increased and the component's performance is improved.

In some embodiments, the shield 310 may provide structural stability to the package assembly. Structural stability may decrease warpage and reduce package deformation risk. The shield 310 may be formed from, for example, copper, aluminum alloys, high thermal conductivity ceramics, composite graphite, etc.

Figure 4:
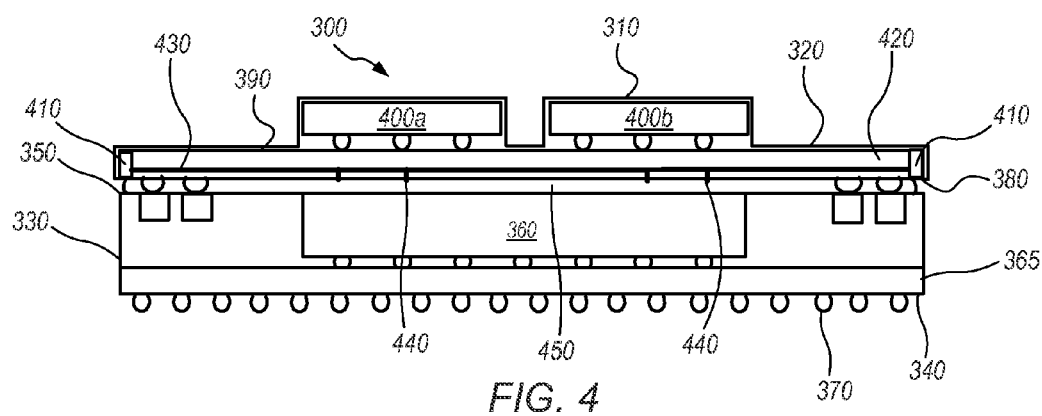
FIG. 4 depicts an embodiment of a thermally enhanced package on package format including a shield configured to dissipate heat. At least some of the electrical conductors are not depicted for the sake of clarity.

In some embodiments, the package on package assembly 300 may include at least one exposed thermal conductor 410 (e.g., as depicted in FIGS. 3-4). The exposed thermal conductor 410 may be positioned in the second package 320 adjacent the third surface 380. At least one of the exposed thermal conductors 410 may be exposed through a perimeter surface of the second package 320 (230). The shield 310 may be thermally coupled to at least one of the exposed thermal conductors 410. The shield 310 may be thermally coupled to at least one of the exposed thermal conductors 410 through direct contact between the shield 310 and the thermal conductor 410.

In some embodiments, the shield 310 is applied to at least a portion of the perimeter of the second package 320 such that the shield is in contact with at least one of the exposed thermal conductors 410.

In some embodiments, the exposed thermal conductor 410 may be positioned in a second substrate 420 which, in some embodiments, may also be an RDL. Substrates 365 and 420 may include materials such as, but not limited to, glass fiber, PPG, ABF, PI (polyimide), PBO (polybenzoxazole), BCB (benzocyclobutene), and WPRs (wafer photo resists such as novolak resins and poly(hydroxystyrene) (PHS) available commercially under the trade name WPR including WPR-1020, WPR-1050, and WPR-1201 (WPR is a registered trademark of JSR Corporation, Tokyo, Japan)). Substrates 365 and 420 may be formed using techniques known in the art (e.g., techniques used for polymer deposition).

In some embodiments, the package on package assembly may include a plurality of wires 430 (e.g., as depicted in FIGS. 3-5). The plurality of wires 430 may be positioned in the second package 320 thermally coupling the first die 360 to at least one of the exposed thermal conductors 410 (240). In some embodiments, the plurality of wires 430 may be positioned in the second substrate 420. Heat may be transferred from the first die 360 using a shield 310 coupled to at least one of the exposed thermal conductors 410 (250). The substrate 420 may include one or more layers of wires or routing. In certain embodiments, the substrate 420 may include two or more layers of wiring or routing. The routing may be, for example, copper wiring or another suitable electrical conductor wiring. A thickness of the substrate 420 may depend on the number of layers of routing in the substrate. For example, each layer of routing may be between about 5 μm and about 10 μm in thickness. In certain embodiments, substrate 420 may have a thickness of at least about 5 μm and at most about 150 μm. Wiring thermally coupling the first die 360 to the exposed thermal conductor 410 and shield 310 may be isolated relative to other wiring in the substrate 420 which may function to electrically couple electrical components of the assembly 300.

In some embodiments, the shield 310 may be electrically isolated such that the shield 310 does not act as an electromagnetic shield. In such embodiments, the wiring and exposed thermal conductors thermally connecting the first die to the shield 310 are electrically isolated (e.g., not grounded).

In some embodiments, the package on package assembly 300 may include thermal contacts 440 (e.g., as depicted in FIGS. 3-5). The thermal contacts may be positioned on the third surface. The thermal contacts 440 may thermally couple, during use, the first die to the plurality of wires. Thermal contacts 440 may include metal balls or pillars (e.g., copper, gold, tin, tin/gold, tin/silver, tin/copper, tin/silver/copper), metal plates, or a mesh design (e.g., a criss-crossing trace pattern forming a grid pattern).

Figure 5A:
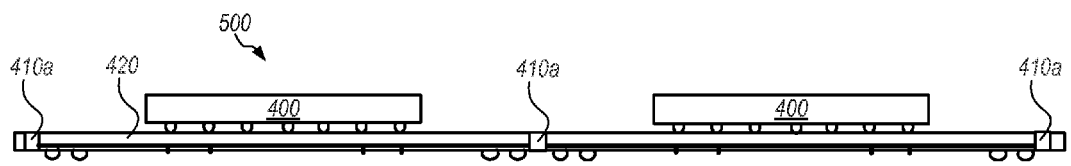
FIGS. 5A-D depict an embodiment of an assembly of several thermally enhanced package on package formats.
Figure 5B:
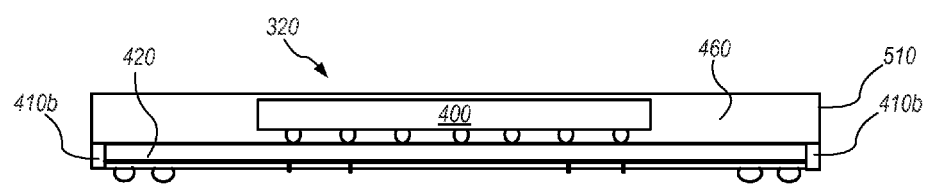
Figure 5C:
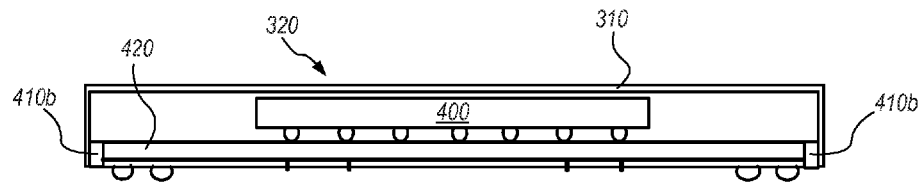
Figure 5D:
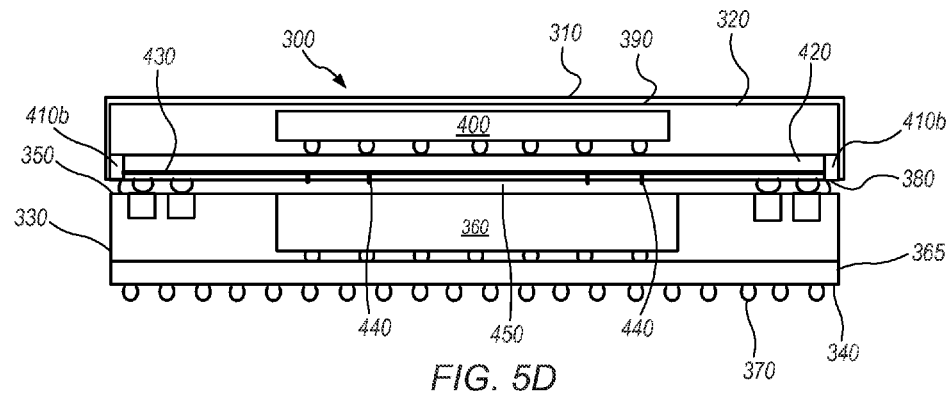

In some embodiments, the package on package assembly 300 may include a thermal interface material 450 (e.g., as depicted in FIGS. 3, 4, and 5D). The thermal interface material 450 may thermally couple the first die 360 to thermal contacts 440 and the plurality of wires 430. The thermal interface material may extend out beyond the first die 360, in some embodiments, to at least where the first package 330 and the second package 320 are electrically coupled or up to package edges. Thermal interface material 450 may include adhesive, thermal grease, an adhesive film, thermal gel, epoxy, underfill, NCP, NCF, ACP, ACF, etc. In some embodiments, thermal interface material 450 may include a viscous fluid substance which increases the thermal conductivity of a thermal interface by filling air-gaps present due to the imperfectly flat and smooth surfaces of the components. The material may have far greater thermal conductivity than air. In electronics, it is often used to aid a component's thermal dissipation via a heat sink. The thermal interface material 450 may be based upon one or more materials including ceramics, metals, carbon, liquid metal, or phase change metal alloy.

In some embodiments, the shield 310 comprises at least one layer of material applied using sputtering or plating. The shield may be deposited using an electrolytic plating, electroless plating, sputtering, physical vapor deposition ("PVD"), chemical vapor deposition ("CVD"), or other suitable metal deposition process. For non-metal materials, the shield may be applied by lamination, spraying, or painting. The material comprises a metal. The material may include copper, nickel, gold, stainless steel or aluminum. Applying the shield in such a manner may result in a thermally efficient package with a reduced Z-height relative to standard heat shields as depicted in FIG. 1.

In some embodiments, thermal shield 310 may be applied to a die, for example, in a flip chip or a wafer level fan-out package. FIG. 4 depicts an embodiment of a thermally enhanced package on package format 300 including a shield 310 configured to dissipate heat. At least some of the electrical conductors are not depicted for the sake of clarity. In the embodiment depicted in FIG. 4, thermal shield 310 may be applied directly to the second dies 400a-b. The second dies 400a-b may formed in a flip chip or a wafer level fan-out package assembly.

In some embodiments, the semiconductor device package assembly may include a shield 310 (e.g., as depicted in FIGS. 3, 4, and 5C-D). The shield may inhibit electromagnetic interference. Electromagnetic shielding reduces or inhibits the electromagnetic field in a space by blocking the field with barriers made of conductive or magnetic materials. The shielding may reduce the coupling of, for example, radio waves, electromagnetic fields and electrostatic fields. The thermal shield 310 may function as an EMI shield if the shield 310 is electrically grounded.

The amount of reduction depends upon the material used, its thickness, the size of the shielded volume and the frequency of the fields of interest. The amount of reduction depends upon the size, shape and orientation of apertures in a shield to an incident electromagnetic field. Any holes in the shield or mesh must be significantly smaller than the wavelength of the radiation that is being kept out (or the shield will not effectively approximate an unbroken conducting surface).

In some embodiments, the shield 310 comprises an electrically conductive material. The shield 310 may be applied to an upper surface of the semiconductor device package assembly. The shield 310 may be electrically coupled to at least one of the exposed electrical conductors. The shield 310 may function to inhibit, during use, electromagnetic interference. In some embodiments, the exposed electrical conductor electrically grounds the shield. In some embodiments, the exposed electrical conductor is electrically coupled such that the shield is electrically grounded during use.

Typical materials used for electromagnetic shielding may include copper or nickel, in the form of very small particulates. The material may be sprayed on to the package assembly and, once dry, produces a continuous conductive layer of metal. The shielding layer may include aluminum, ferrite, carbonyl iron, stainless steel, nickel silver, low-carbon steel, silicon-iron steel, foil, conductive resin, and other metals and composites capable of blocking or absorbing EMI, RFI, and other inter-device interference. In some embodiments, the shield may include a non-metal material such as carbon-black or aluminum flake to reduce the effects of EMI and RFI. The shield may be deposited using electrolytic plating, electroless plating, sputtering, physical vapor deposition ("PVD"), chemical vapor deposition ("CVD"), or other suitable metal deposition process. For non-metal materials, the shield may be applied by lamination, spraying, or painting.

In some embodiments, the shield comprises a plurality of layers. The shield comprises a plurality of layers comprising a permeability difference between adjacent layers. Layering using different materials with different properties may allow the shield to inhibit interference resulting from different wavelengths of radiation.

FIGS. 5A-D depict an embodiment of an assembly of several thermally enhanced package on package formats 300. FIG. 5A depicts a set of packages manufactured at the same time starting as a single unit 500. This may be done in order to decrease costs of manufacture. Multiple second dies 400 may be assembled together on a single second substrate 420. Units 500 may include electrical conductors. In some embodiments, units 500 may be formed without electrical conductors.

FIG. 5B depicts a set of packages manufactured at the same time as a single unit 500 after an encapsulant 460 has been applied and a second package 320 has been singulated from a single unit 500. Singulation (e.g., saw singulation) cuts a large set of packages 500 into individual second packages 320. Singulation may be conducted such that thermal conductors 410a are cut forming electrical conductors 410b which are at least partially exposed along the perimeter surface 510 of second package 320.

FIG. 5C depicts a second package 320 after a shield 310 has been applied the second package. The shield may include one or more layers. The shield may be deposited using electrolytic plating, electroless plating, sputtering, spray, physical vapor deposition ("PVD"), chemical vapor deposition ("CVD"), or other suitable metal deposition process. For non-metal materials, the shield may be applied by lamination, spraying, or painting. In some embodiments, the shield may be thermally coupled during use. The shield may be thermally coupled to exposed electrical conductors 410b. The shield may form a substantially continuous layer over the package and be coupled to the exposed electrical conductors 410b through direct contact.

FIG. 5D depicts a second package 320 after a shield 310 has been applied and the second package has been coupled to a first package 330. The first die 360 may be thermally coupled the second package 320 using a thermal interface material 450 forming assembly 300.

Numerous variations and modifications will become apparent to those skilled in the art once the above disclosure is fully appreciated. It is intended that the following claims be interpreted to embrace all such variations and modifications.

What is claimed is:

1. A semiconductor device package on package assembly, comprising:
    a first package comprising a first surface, a second surface substantially opposite the first surface, a first die, and a first set of electrical conductors coupled to the first surface and configured to electrically connect the package on package assembly;
    a second package comprising a substrate having a third surface and a fourth surface substantially opposite the third surface, and a second die, wherein the third surface is coupled to the second surface, and wherein the first package is electrically coupled to the second package, the substrate further including a fifth surface that is substantially perpendicular to the third surface and the fourth surface;
    at least one exposed thermal conductor positioned in the second package on the fifth surface of the substrate such that the at least one exposed thermal conductor exposes through a perimeter surface of the second package;
    a plurality of wires positioned in the second package thermally coupling the first die to the at least one exposed thermal conductor; and
    a shield on the fourth surface of the semiconductor device package assembly, wherein at least a portion of the shield directly contacts the at least one exposed thermal conductor on at least a portion of the fifth surface of the substrate of the second package, wherein the shield is thermally coupled to the at least one exposed thermal conductor, and wherein the shield transfers, during use, heat from the first die.

2. The assembly of claim 1, wherein the shield is electrically isolated.

3. The assembly of claim 1, further comprising thermal contacts positioned on the third surface, wherein the thermal contacts thermally couple, during use, the first die to the plurality of wires.

4. The assembly of claim 1, further comprising a thermal interface material thermally coupling the first die to the plurality of wires.

5. The assembly of claim 1, wherein the shield inhibits electromagnetic interference.

6. The assembly of claim 1, wherein the shield is electrically grounded using the at least one exposed electrical conductor.

7. The assembly of claim 1, wherein the shield comprises a plurality of layers comprising a permeability difference between adjacent layers.

8. The assembly of claim 1, wherein the shield comprises at least one layer of material applied using sputtering or plating, and wherein the material comprises a metal.

9. The assembly of claim 8, wherein the material comprises copper, nickel, gold, stainless steel or aluminum.

10. A semiconductor device package on package assembly, comprising:
    a first package comprising a first surface, a second surface substantially opposite the first surface, a first die, and a first set of electrical conductors coupled to the first surface and configured to electrically connect the package on package assembly;
    a second package comprising a substrate having a third surface and a fourth surface substantially opposite the third surface, and a second die, wherein the third surface is coupled to the second surface, and wherein the first package is electrically coupled to the second package, the substrate further including a fifth surface that is substantially perpendicular to the third surface and the fourth surface;
    at least one exposed thermal conductor positioned in the second package on the fifth surface of the substrate such that the at least one exposed thermal conductor exposes through a perimeter surface of the second package;
    a plurality of wires positioned in the second package thermally coupling the first die to the at least one exposed thermal conductor; and
    a shield directly on the fourth surface and directly contacts the at least one exposed thermal conductor on at least a portion of the fifth surface of the substrate of the second package of the semiconductor device package assembly, and wherein the shield transfers, during use, heat from the first die, and wherein the shield is electrically isolated.

11. The assembly of claim 10, further comprising thermal contacts positioned on the third surface, wherein the thermal contacts thermally couple, during use, the first die to the plurality of wires.

12. The assembly of claim 10, further comprising a thermal interface material thermally coupling the first die to the plurality of wires.

13. The assembly of claim 10, wherein the shield inhibits electromagnetic interference.

14. The assembly of claim 10, wherein the shield is electrically grounded using the at least one exposed electrical conductor.

15. The assembly of claim 10, wherein the shield comprises a plurality of layers comprising a permeability difference between adjacent layers.

16. The assembly of claim 10, wherein the shield comprises at least one layer of material applied using sputtering or plating, and wherein the material comprises a metal.

17. The assembly of claim 10, wherein the material comprises copper, nickel, gold, stainless steel or aluminum.

* * * * *